US012235334B2

(12) United States Patent
Umehara et al.

(10) Patent No.: US 12,235,334 B2
(45) Date of Patent: *Feb. 25, 2025

(54) SENSOR INCLUDING AT LEAST ONE INCLINED SURFACE

(71) Applicant: TDK CORPORATION, Tokyo (JP)

(72) Inventors: Hiromichi Umehara, Tokyo (JP); Keita Kawamori, Tokyo (JP); Kenzo Makino, Tokyo (JP); Masachika Hashino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/524,904

(22) Filed: Nov. 30, 2023

(65) Prior Publication Data

US 2024/0094313 A1 Mar. 21, 2024

Related U.S. Application Data

(63) Continuation of application No. 17/945,397, filed on Sep. 15, 2022, now Pat. No. 11,867,779.

(60) Provisional application No. 63/246,437, filed on Sep. 21, 2021.

(30) Foreign Application Priority Data

Aug. 26, 2022 (JP) ................................. 2022-134769

(51) Int. Cl.
*G01R 33/09* (2006.01)
*G01R 33/00* (2006.01)

(52) U.S. Cl.
CPC ....... *G01R 33/093* (2013.01); *G01R 33/0047* (2013.01)

(58) Field of Classification Search
CPC ............. G01R 33/093; G01R 33/0047; G01R 33/0017; G01R 33/0052; G01R 33/0206; G01R 33/098
See application file for complete search history.

(56) References Cited

U.S. PATENT DOCUMENTS

| 2006/0176142 | A1* | 8/2006 | Naito | ..................... | H10N 50/01 257/E27.005 |
| 2009/0268349 | A1* | 10/2009 | Makino | ................ | G11B 5/1278 360/314 |
| 2009/0273863 | A1* | 11/2009 | Kawano | ................ | G11B 5/3163 156/60 |
| 2012/0272514 | A1* | 11/2012 | Naito | ..................... | H10N 50/01 29/602.1 |

(Continued)

FOREIGN PATENT DOCUMENTS

| JP | S59-013348 A | 1/1984 |
| JP | H05-326462 A | 12/1993 |

*Primary Examiner* — Alvaro E Fortich
(74) *Attorney, Agent, or Firm* — Oliff PLC

(57) ABSTRACT

A magnetic sensor includes an insulating layer, a first MR element, and a second MR element. The insulating layer includes a first layer and a second layer, and also includes first and second inclined surfaces formed across the first layer and the second layer. Each of the first and second MR elements includes a magnetization pinned layer and a free layer. The magnetization pinned layer and the free layer of the first MR element are disposed on the first inclined surface. The magnetization pinned layer and the free layer of the second MR element are disposed on the second inclined surface.

18 Claims, 10 Drawing Sheets

(56) References Cited

U.S. PATENT DOCUMENTS

2021/0156933 A1 5/2021 Makino et al.
2021/0302511 A1* 9/2021 Makino .................. H10N 50/85

* cited by examiner

SENSOR INCLUDING AT LEAST ONE INCLINED SURFACE

CROSS REFERENCE TO RELATED APPLICATIONS

This application is a continuation application of U.S. patent application Ser. No. 17/945,397, filed on Sep. 15, 2022, which claims the benefit of U.S. Provisional Patent Application No. 63/246,437 filed on Sep. 21, 2021 and Japanese Priority Patent Application No. 2022-134769 filed on Aug. 26, 2022, the entire contents of each of which are incorporated herein by their reference.

BACKGROUND

The technology relates to a sensor including an insulating layer interposed between a metal layer and a sensor element.

Magnetic sensors using magnetoresistive elements have been used for various applications in recent years. A system including a magnetic sensor may be intended to detect a magnetic field containing a component in a direction perpendicular to the surface of a substrate by using a magnetoresistive element provided on the substrate. In such a case, the magnetic field containing the component in the direction perpendicular to the surface of the substrate can be detected by providing a soft magnetic body for converting a magnetic field in the direction perpendicular to the surface of the substrate into a magnetic field in the direction parallel to the surface of the substrate or locating the magnetoresistive element on an inclined surface formed on the substrate.

U.S. Patent Application Publication No. 2006/0176142 A1 discloses a magnetic sensor in which an X-axis sensor, a Y-axis sensor, and a Z-axis sensor are provided on a substrate. Magnetoresistive elements constituting the Z-axis sensor are provided on inclined surfaces of protruding portions formed on a base film of the substrate. The protruding portions are formed by dry-etching a thick film of silicon oxide.

In the magnetic sensor disclosed in U.S. Patent Application Publication No. 2006/0176142 A1, wiring layers and the like are provided on the substrate in advance. The base film includes an insulating film formed on the wiring layers. Herein, a case is considered where electrode pads to be connected to the wiring layers provided on the substrate are provided on the top surface of the insulating film. In such a case, the insulating film is embedded with a structure of a metallic material for connecting the wiring layers and the electrode pads. In U.S. Patent Application Publication No. 2006/0176142 A1, to form the protruding portions on the insulating film as the base film, dry etching is performed on the insulating film. However, when the insulating film embedded with the structure made of metallic material is etched, a problem would arise that the structure protrudes beyond the top surface of the insulating film to a great degree due to the difference in the etching rate.

Not only for the magnetic sensor disclosed in U.S. Patent Application Publication No. 2006/0176142 A1 but also for a sensor obtained by forming sensor elements on inclined surfaces, there may be a case where wiring layers are formed on the base side of the inclined surfaces from the perspective of reducing the size and simplifying the formation process. Thus, the foregoing problem is true of not only magnetic sensors but also sensors in general that are obtained by forming sensor elements on inclined surfaces.

SUMMARY

A sensor according to one embodiment of the technology is a sensor configured to detect a predetermined physical quantity. The sensor according to one embodiment of the technology includes a substrate including a top surface, a support member disposed on the substrate, and a sensor element configured to change in a physical property depending on a predetermined physical quantity. The support member includes a first layer and a second layer disposed on the first layer, and also includes at least one inclined surface formed across the first layer and the second layer. The sensor element includes a functional layer constituting at least a part of the sensor element. The functional layer is disposed on the at least one inclined surface.

In the sensor according to one embodiment of the technology, the support member includes at least one inclined surface. The functional layer of the sensor element is disposed on the at least one inclined surface. The at least one inclined surface is formed across the first layer and the second layer of the support member. Thereby, according to one embodiment of the technology, in a sensor obtained by forming a functional layer of a sensor element on an inclined surface of a support member, a structure can be embedded in the support member.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
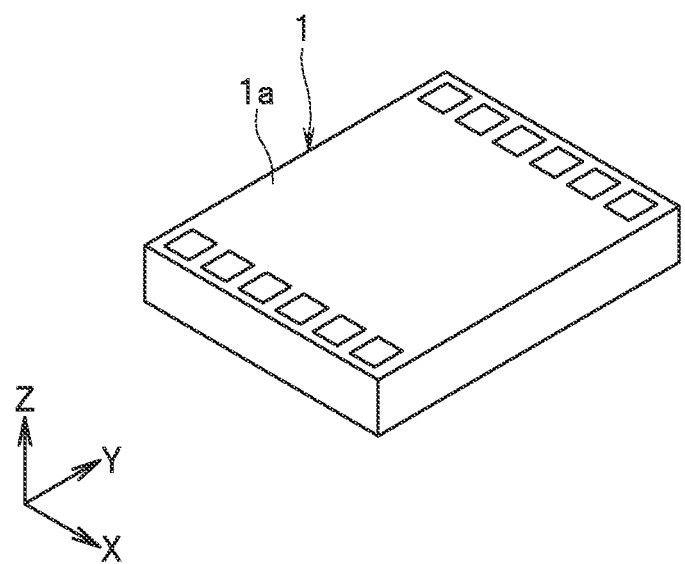
FIG. 1 is a perspective view showing a magnetic sensor according to an example embodiment of the technology.

An object of the technology is to provide a sensor obtained by forming a functional layer of a sensor element on an inclined surface of a support member, wherein a structure can be embedded in the support member.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

An example embodiment of the technology described below relates to a sensor configured to detect a predetermined physical quantity. In the example embodiment, the sensor includes sensor elements each configured to change in a physical property depending on the predetermined physical quantity. For example, the predetermined physical quantity may be at least one of the direction or strength of a target magnetic field that is a magnetic field to be detected. In such a case, the sensor elements may be magnetic detection elements each configured to detect a change in at least one of the direction or strength of the target magnetic field. The sensor including magnetic detection elements is also referred to as a magnetic sensor. The magnetic sensor is configured to detect at least one of the direction or strength of the target magnetic field. Hereinafter, an example embodiment will be described in detail by taking a case where the sensor is a magnetic sensor as an example.

Figure 2:
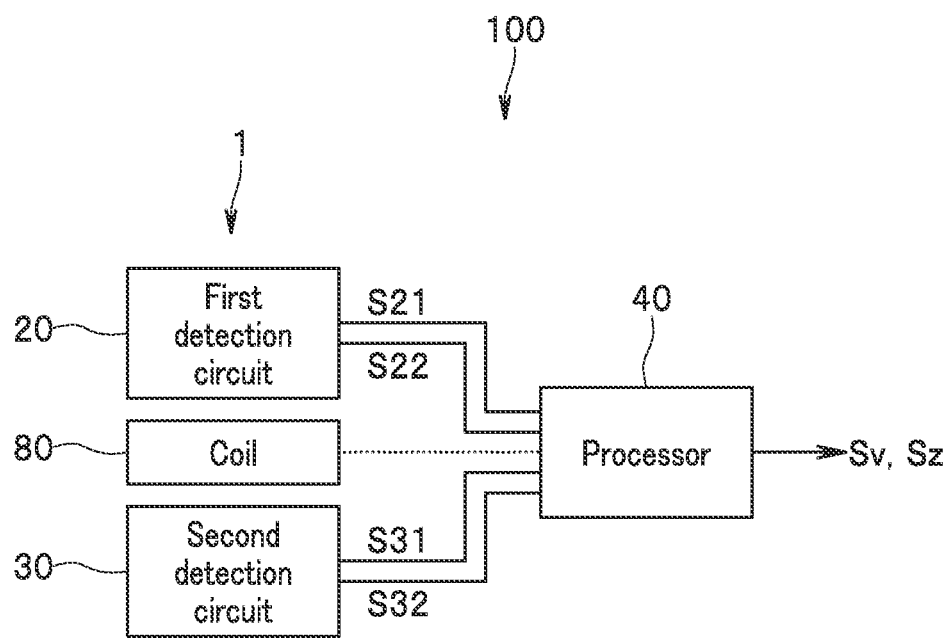
FIG. 2 is a functional block diagram showing a configuration of a magnetic sensor device including the magnetic sensor according to the example embodiment of the technology.

First, a configuration of a magnetic sensor according to an example embodiment of the technology will be described with reference to FIGS. 1 and 2. FIG. 1 is a perspective view showing a magnetic sensor according to the example embodiment. FIG. 2 is a functional block diagram showing a configuration of a magnetic sensor device including the magnetic sensor according to the example embodiment. The magnetic sensor 1 according to the example embodiment corresponds to the "sensor" of the technology.

As shown in FIG. 1, the magnetic sensor 1 is in the form of a chip having a rectangular parallelepiped shape. The magnetic sensor 1 includes a top surface 1a and a bottom surface located opposite to each other and also includes four side surfaces connecting the top surface 1a to the bottom surface. The magnetic sensor 1 also includes a plurality of electrode pads disposed on the top surface 1a.

Now, a description will be given of a reference coordinate system in the present example embodiment with reference to FIG. 1. The reference coordinate system is an orthogonal coordinate system that is set with reference to a magnetic sensor 1 and defined by three axes. An X direction, a Y direction, and a Z direction are defined in the reference coordinate system. The X, Y, and Z directions are orthogonal to each other. In particular, in the example embodiment, a direction that is perpendicular to the top surface 1a of the magnetic sensor 1 and is oriented from the bottom surface to the top surface 1a of the magnetic sensor 1 is defined as the Z direction. The opposite directions to the X, Y, and Z directions will be expressed as −X, −Y, and −Z directions, respectively. The three axes defining the reference coordinate system are an axis parallel to the X direction, an axis parallel to the Y direction, and an axis parallel to the Z direction.

Hereinafter, the term "above" refers to positions located forward of a reference position in the Z direction, and "below" refers to positions opposite from the "above" positions with respect to the reference position. For each component of the magnetic sensor 1, the term "top surface" refers to a surface of the component located at the end thereof in the Z direction, and "bottom surface" refers to a surface of the component located at the end thereof in the −Z direction. The phrase "when seen in the Z direction" means that an object is seen from a position at a distance in the Z direction.

As shown in FIG. 2, the magnetic sensor 1 includes a first detection circuit 20 and a second detection circuit 30. Each of the first and second detection circuits 20 and 30 includes a plurality of magnetic detection elements, and is configured to detect a target magnetic field to generate at least one detection signal. In particular, in the example embodiment, the plurality of magnetic detection elements are a plurality of magnetoresistive elements. The magnetoresistive elements will hereinafter be referred to as MR elements.

A plurality of detection signals generated by the first and second detection circuits 20 and 30 are processed by a processor 40. The magnetic sensor 1 and the processor 40 constitute a magnetic sensor device 100. The processor 40 is configured to, by processing the plurality of detection signals generated by the first and second detection circuits 20 and 30, generate a first detection value and a second detection value respectively having correspondences with components of a magnetic field in two different directions at a predetermined reference position. In particular, in the present example embodiment, the foregoing two different directions are a direction parallel to an XY plane and a direction parallel to the Z direction. For example, the processor 40 is constructed of an application-specific integrated circuit (ASIC).

The processor 40 may be included in a support supporting the magnetic sensor 1, for example. The support includes a plurality of electrode pads. The first and second detection circuits 20 and 30 are connected to the processor 40 via the plurality of electrode pads of the magnetic sensor 1, the plurality of electrode pads of the support, and a plurality of bonding wires, for example. In a case where the plurality of electrode pads of the magnetic sensor 1 are provided on the top surface 1a of the magnetic sensor 1, the magnetic sensor 1 may be mounted on the top surface of the support in such a posture that the bottom surface of the magnetic sensor 1 faces the top surface of the support.

Figure 3:
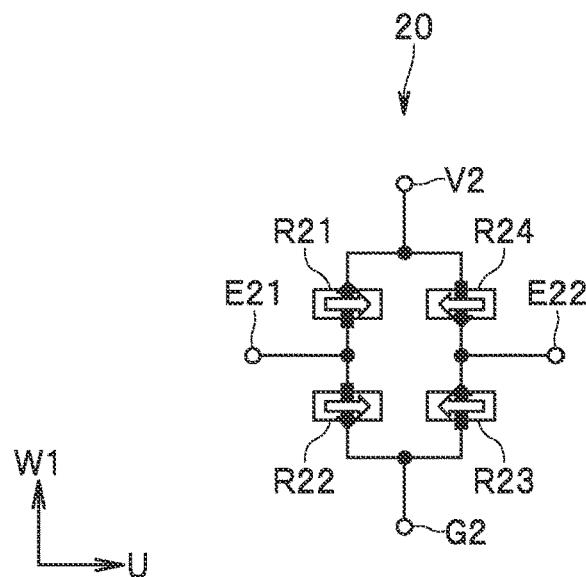
FIG. 3 is a circuit diagram showing a circuit configuration of a first detection circuit of the example embodiment of the technology.
Figure 4:
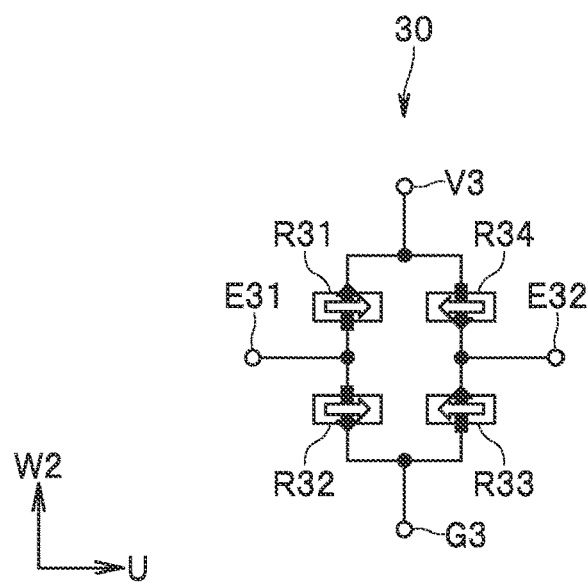
FIG. 4 is a circuit diagram showing a circuit configuration of a second detection circuit of the example embodiment of the technology.
Figure 5:
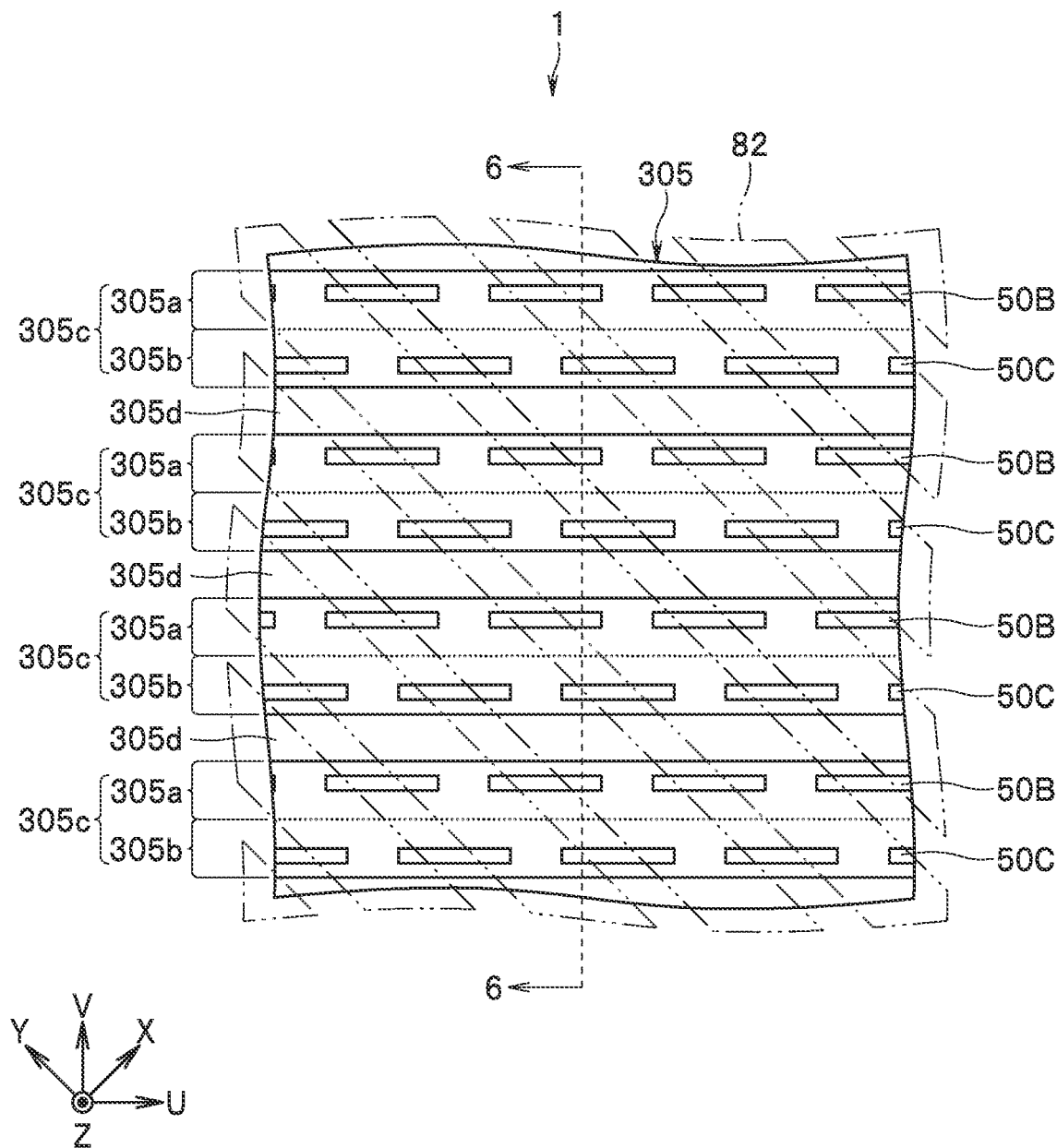
FIG. 5 is a plan view showing a part of the magnetic sensor according to the example embodiment of the technology.
Figure 6:
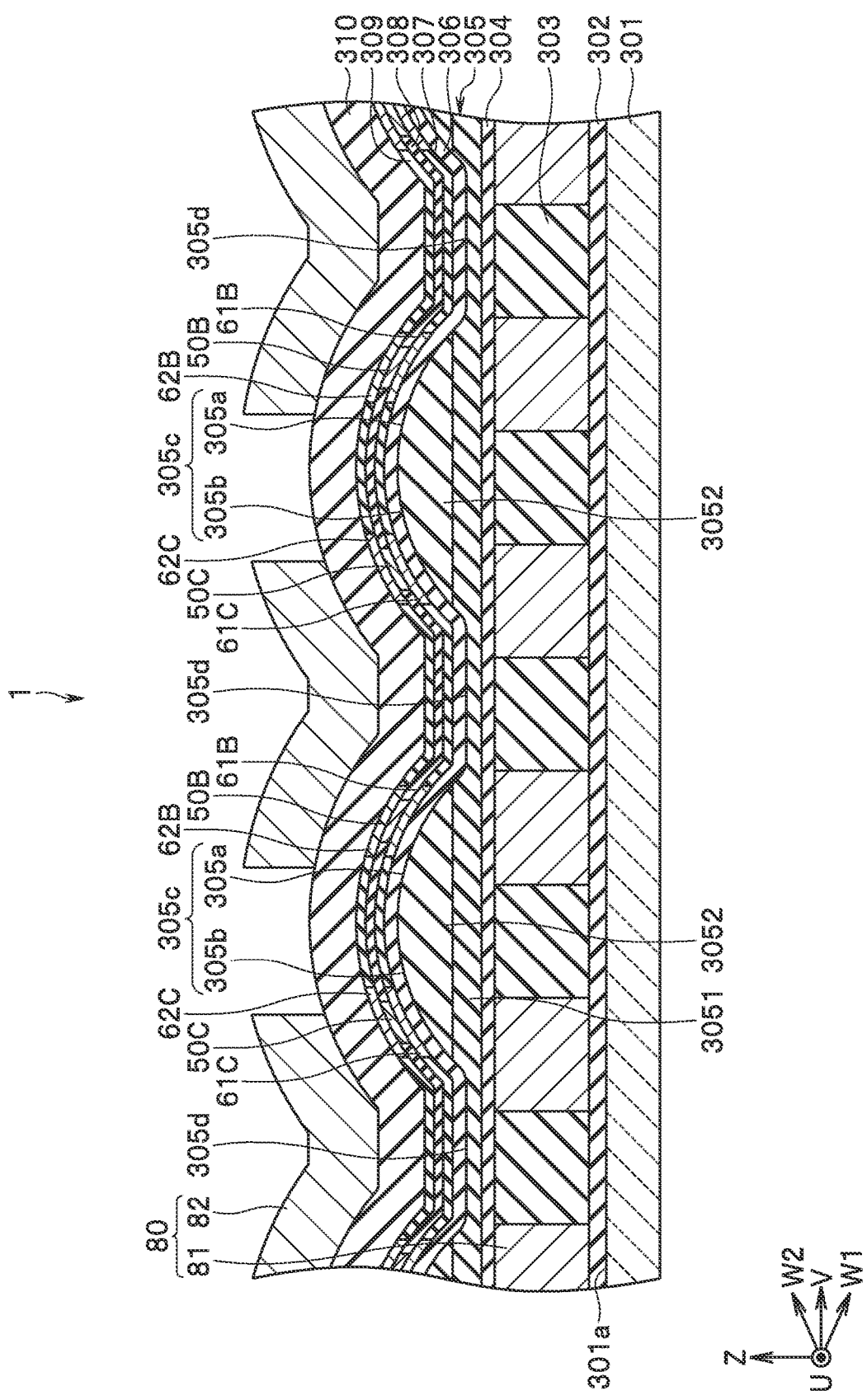
FIG. 6 is a sectional view showing a part of the magnetic sensor according to the example embodiment of the technology.

Next, the first and second detection circuits 20 and 30 will be described with reference to FIGS. 3 to 6. FIG. 3 is a circuit diagram showing a circuit configuration of the first detection circuit 20. FIG. 4 is a circuit diagram showing a circuit configuration of the second detection circuit 30. FIG. 5 is a plan view showing a part of the magnetic sensor 1. FIG. 6 is a sectional view showing a part of the magnetic sensor 1.

Here, as shown in FIG. 5, a U direction and a V direction are defined as follows. The U direction is a direction rotated from the X direction to the −Y direction. The V direction is a direction rotated from the Y direction to the X direction. More specifically, in the present example embodiment, the U direction is set to a direction rotated from the X direction to the −Y direction by a, and the V direction is set to a direction rotated from the Y direction to the X direction by a. Note that a is an angle greater than 0° and smaller than 90°. For example, a is 45°. −U direction refers to a direction opposite to the U direction, and −V direction refers to a direction opposite to the V direction.

As shown in FIG. 6, a W1 direction and a W2 direction are defined as follows. The W1 direction is a direction rotated from the V direction to the −Z direction. The W2 direction is a direction rotated from the V direction to the Z direction. More specifically, in the present example embodiment, the W1 direction is set to a direction rotated from the V direction to the −Z direction by p, and the W2 direction is set to a direction rotated from the V direction to the Z direction by p. Note that R is an angle greater than 0° and smaller than 90°. −W1 direction refers to a direction opposite to the W1 direction, and −W2 direction refers to a direction opposite to the W2 direction. The W1 direction and W2 direction both are orthogonal to the U direction.

The first detection circuit 20 is configured to detect a component of the target magnetic field in a direction parallel to the W1 direction and generate at least one first detection signal which has a correspondence with the component. The second detection circuit 30 is configured to detect a component of the target magnetic field in a direction parallel to the W2 direction and generate at least one second detection signal which has a correspondence with the component.

As shown in FIG. 3, the first detection circuit 20 includes a power supply port V2, a ground port G2, signal output ports E21 and E22, a first resistor section R21, a second resistor section R22, a third resistor section R23, and a fourth resistor section R24. The plurality of MR elements of the first detection circuit 20 constitute the first to fourth resistor sections R21, R22, R23, and R24.

The first resistor section R21 is provided between the power supply port V2 and the signal output port E21. The second resistor section R22 is provided between the signal output port E21 and the ground port G2. The third resistor section R23 is provided between the signal output port E22 and the ground port G2. The fourth resistor section R24 is provided between the power supply port V2 and the signal output port E22.

As shown in FIG. 4, the second detection circuit 30 includes a power supply port V3, a ground port G3, signal output ports E31 and E32, a first resistor section R31, a second resistor section R32, a third resistor section R33, and a fourth resistor section R34. The plurality of MR elements of the second detection circuit 30 constitute the first to fourth resistor sections R31, R32, R33, and R34.

The first resistor section R31 is provided between the power supply port V3 and the signal output port E31. The second resistor section R32 is provided between the signal output port E31 and the ground port G3. The third resistor section R33 is provided between the signal output port E32 and the ground port G3. The fourth resistor section R34 is provided between the power supply port V3 and the signal output port E32.

A voltage or current of a predetermined magnitude is applied to each of the power supply ports V2 and V3. Each of the ground ports G2 and G3 is connected to the ground.

The plurality of MR elements of the first detection circuit 20 will be referred to as a plurality of first MR elements 50B. The plurality of MR elements of the second detection circuit 30 will be referred to as a plurality of second MR elements 50C. Since the first and second detection circuits 20 and 30 are the components of the magnetic sensor 1, it can be said that the magnetic sensor 1 includes the plurality of first MR elements 50B and the plurality of second MR elements 50C. Any given MR element will be denoted by the reference numeral 50.

Figure 7:
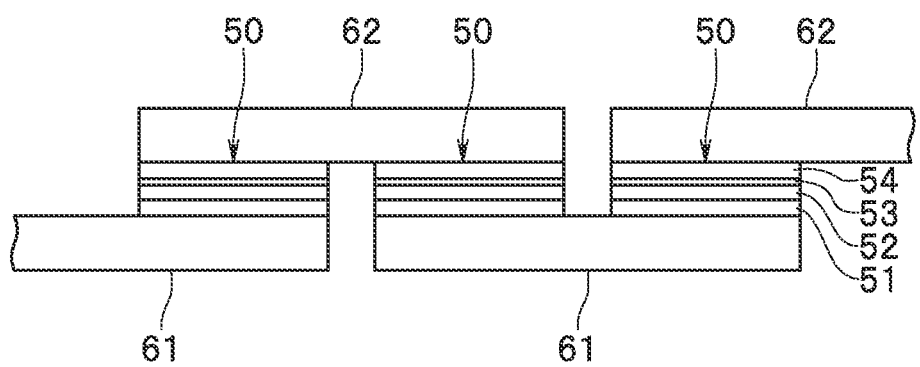
FIG. 7 is a side view showing a magnetoresistive element of the example embodiment of the technology.

FIG. 7 is a side view showing an MR element 50. The MR element 50 is specifically a spin-valve MR element. The MR element 50 includes a magnetization pinned layer 52 having a magnetization whose direction is fixed, a free layer 54 having a magnetization whose direction is variable depending on the direction of a target magnetic field, and a gap layer 53 located between the magnetization pinned layer 52 and the free layer 54. The MR element 50 may be a tunneling magnetoresistive (TMR) element or a giant magnetoresistive (GMR) element. In the TMR element, the gap layer 53 is a tunnel barrier layer. In the GMR element, the gap layer 53 is a nonmagnetic conductive layer. The resistance of the MR element 50 changes with the angle that the magnetization direction of the free layer 54 forms with respect to the magnetization direction of the magnetization pinned layer 52. The resistance of the MR element 50 is at its minimum value when the foregoing angle is 0°, and at its maximum value when the foregoing angle is 180°. In each MR element 50, the free layer 54 has a shape anisotropy that sets the direction of the magnetization easy axis to be orthogonal to the magnetization direction of the magnetization pinned layer 52. As a method for setting the magnetization easy axis in a predetermined direction in the free layer 54, a magnet configured to apply a bias magnetic field to the free layer 54 can be used.

The MR element 50 further includes an antiferromagnetic layer 51. The antiferromagnetic layer 51, the magnetization pinned layer 52, the gap layer 53, and the free layer 54 are stacked in this order. The antiferromagnetic layer 51 is formed of an antiferromagnetic material, and is in exchange coupling with the magnetization pinned layer 52 to thereby pin the magnetization direction of the magnetization pinned layer 52. The magnetization pinned layer 52 may be a so-called self-pinned layer (Synthetic Ferri Pinned layer, SFP layer). The self-pinned layer has a stacked ferri structure in which a ferromagnetic layer, a nonmagnetic intermediate layer, and a ferromagnetic layer are stacked, and the two ferromagnetic layers are antiferromagnetically coupled. In a case where the magnetization pinned layer 52 is the self-pinned layer, the antiferromagnetic layer 51 may be omitted.

It should be appreciated that the layers 51 to 54 of each MR element 50 may be stacked in the reverse order to that shown in FIG. 7.

In FIGS. 3 and 4, solid arrows represent the magnetization directions of the magnetization pinned layers 52 of the MR elements 50. Hollow arrows represent the magnetization directions of the free layers 54 of the MR elements 50 in a case where no target magnetic field is applied to the MR elements 50.

In the example shown in FIG. 3, the magnetization directions of the magnetization pinned layers 52 in each of the first and third resistor sections R21 and R23 are the W1 direction. The magnetization directions of the magnetization pinned layers 52 in each of the second and fourth resistor sections R22 and R24 are the −W1 direction. The free layer 54 in each of the plurality of first MR elements 50B has a shape anisotropy that sets the direction of the magnetization easy axis to a direction parallel to the U direction. The magnetization directions of the free layers 54 in each of the first and second resistor sections R21 and R22 in a case where no target magnetic field is applied to the first MR elements 50B are the U direction. The magnetization directions of the free layers 54 in each of the third and fourth resistor sections R23 and R24 in the foregoing case are the −U direction.

In the example shown in FIG. 4, the magnetization directions of the magnetization pinned layers 52 in each of the first and third resistor sections R31 and R33 are the W2 direction. The magnetization directions of the magnetization pinned layers 52 in each of the second and fourth resistor sections R32 and R34 are the −W2 direction. The free layer 54 in each of the plurality of second MR elements 50C has a shape anisotropy that sets the direction of the magnetization easy axis to a direction parallel to the U direction. The magnetization directions of the free layers 54 in each of the first and second resistor sections R31 and R32 in a case where no target magnetic field is applied to the second MR elements 50C are the U direction. The magnetization directions of the free layers 54 in each of the third and fourth resistor sections R33 and R34 in the foregoing case are the −U direction.

The magnetic sensor 1 includes a magnetic field generator configured to apply a magnetic field in a predetermined direction to the free layer 54 of each of the plurality of first MR elements 50B, and the plurality of second MR elements 50C. In the present example embodiment, the magnetic field generator includes a coil 80 that applies a magnetic field in the predetermined direction to the free layer 54 in each of the plurality of first MR elements 50B and the plurality of second MR elements 50C.

Note that the magnetization directions of the magnetization pinned layers 52 and the directions of the magnetization easy axes of the free layers 54 may slightly deviate from the foregoing directions from the perspective of the accuracy of the manufacturing of the MR elements 50 and the like. The magnetization pinned layers 52 may be magnetized to include magnetization components in the foregoing directions as their main components. In such a case, the magnetization directions of the magnetization pinned layers 52 are the same or substantially the same as the foregoing directions.

Hereinafter, a specific structure of the magnetic sensor 1 will be described in detail with reference to FIGS. 5 and 6. FIG. 6 shows a part of a cross section at a position indicated by the line 6-6 in FIG. 5.

The magnetic sensor 1 includes a substrate 301 with a top surface 301a, insulating layers 302, 303, 304, 305, 306, 307, 308, 309, and 310, a plurality of lower electrodes 61B, a plurality of lower electrodes 61C, a plurality of upper electrodes 62B, a plurality of upper electrodes 62C, a plurality of lower coil elements 81, and a plurality of upper coil elements 82. It is assumed that the top surface 301a of the substrate 301 is parallel to the XY plane. The Z direction is also a direction perpendicular to the top surface 301a of the substrate 301. The coil elements are a part of the coil winding.

The insulating layer 302 is disposed on the substrate 301. The plurality of lower coil elements 81 are disposed on the insulating layer 302. The insulating layer 303 is disposed around the plurality of lower coil elements 81 on the insulating layer 302. The insulating layers 304, 305, and 306 are stacked in this order on the plurality of lower coil elements 81 and the insulating layer 303.

The plurality of lower electrodes 61B and the plurality of lower electrodes 61C are disposed on the insulating layer 306. The insulating layer 307 is disposed around the plurality of lower electrodes 61B and the plurality of lower electrodes 61C on the insulating layer 306. The plurality of first MR elements 50B are disposed on the plurality of lower electrodes 61B. The plurality of second MR elements 50C are disposed on the plurality of lower electrodes 61C. The insulating layer 308 is disposed around the plurality of first MR elements 50B and the plurality of second MR elements 50C on the plurality of lower electrodes 61B, the plurality of lower electrodes 61C, and the insulating layer 307. The plurality of upper electrodes 62B are disposed on the plurality of first MR elements 50B and the insulating layer 308. The plurality of upper electrodes 62C are disposed on the plurality of second MR elements 50C and the insulating layer 308. The insulating layer 309 is disposed around the plurality of upper electrodes 62B and the plurality of upper electrodes 62C on the insulating layer 308.

The insulating layer 310 is disposed on the plurality of upper electrodes 62B, the plurality of upper electrodes 62C, and the insulating layer 309. The plurality of upper coil elements 82 are disposed on the insulating layer 310. The magnetic sensor 1 may further include a not-shown insulating layer that covers the plurality of upper coil elements 82 and the insulating layer 310.

The magnetic sensor 1 includes a support member supporting the plurality of first MR elements 50B and the plurality of second MR elements 50C. The support member includes at least one inclined surface inclined with respect to the top surface 301a of the substrate 301. In particular, in the example embodiment, the support member includes the insulating layer 305. Note that FIG. 5 shows the insulating layer 305, the plurality of first MR elements 50B, the plurality of second MR elements 50C, and the plurality of upper coil elements 82 among the components of the magnetic sensor 1.

The insulating layer 305 includes a plurality of protruding surfaces 305c each protruding in a direction (the Z direction) away from the top surface 301a of the substrate 301. Each of the plurality of protruding surfaces 305c extends in a direction parallel to the U direction. The overall shape of each of the protruding surfaces 305c is a semi-cylindrical curved surface formed by moving the curved shape (arch shape) of the protruding surface 305c shown in FIG. 6 along the direction parallel to the U direction. The plurality of protruding surfaces 305c are arranged at predetermined intervals along a direction parallel to the V direction.

Each of the plurality of protruding surfaces 305c includes an upper end portion farthest from the top surface 301a of the substrate 301. In the example embodiment, each of the upper end portions of the plurality of protruding surfaces 305c extends in the direction parallel to the U direction. Herein, focus is placed on a given protruding surface 305c of the plurality of protruding surfaces 305c. The protruding surface 305c includes a first inclined surface 305a and a second inclined surface 305b. The first inclined surface 305a refers to the part of the protruding surface 305c on the side of the V direction of the upper end portion of the protruding surface 305c. The second inclined surface 305b refers to the part of the protruding surface 305c on the side of the −V direction of the upper end portion of the protruding surface 305c. In FIG. 5, a boundary between the first inclined surface 305a and the second inclined surface 305b is indicated by a dotted line.

The upper end portion of the protruding surface 305c may be the boundary between the first inclined surface 305a and the second inclined surface 305b. In such a case, the dotted line shown in FIG. 5 indicates the upper end portion of the protruding surface 305c.

The top surface 301a of the substrate 301 is parallel to the XY plane. Each of the first inclined surface 305a and the second inclined surface 305b is inclined with respect to the top surface 301a of the substrate 301, that is, the XY plane. In a cross section perpendicular to the top surface 301a of the substrate 301, a distance between the first inclined surface 305a and the second inclined surface 305b becomes smaller in a direction away from the top surface 301a of the substrate 301.

In the example embodiment, since two or more protruding surface 305c are present, the number of each of the first inclined surfaces 305a and the second inclined surfaces 305b is also two or more. The insulating layer 305 includes the plurality of first inclined surfaces 305a and the plurality of second inclined surfaces 305b.

The insulating layer 305 further includes a flat surface 305d present around the plurality of protruding surfaces 305c. The flat surface 305d is a surface parallel to the top surface 301a of the substrate 301. Each of the plurality of protruding surfaces 305c protrudes in the Z direction from the flat surface 305d. In the example embodiment, the plurality of protruding surfaces 305c are disposed at predetermined intervals. Thus, the flat surface 305d is present between the two protruding surfaces 305c adjoining in the V direction.

The insulating layer 305 includes a plurality of protruding portions each protruding in the Z direction, and a flat portion present around the plurality of protruding portions. Each of the plurality of protruding portions extends in the direction parallel to the U direction and includes the protruding surface 305c. The plurality of protruding portions are arranged at predetermined intervals in the direction parallel to the V direction. The thickness (the dimension in the Z direction) of the flat portion is substantially constant.

Note that the insulating layer 304 has a substantially constant thickness (i.e., a dimension in the Z direction), and is formed along the bottom surface of the insulating layer 305. The insulating layer 306 has a substantially constant thickness (i.e., a dimension in the Z direction), and is formed along the top surface of the insulating layer 305.

In particular, in the example embodiment, the insulating layer 305 includes a first layer 3051 disposed on the insulating layer 304, and a second layer 3052 disposed on the first layer 3051. The second layer 3052 includes a plurality of portions separated from one another. The insulating layer 306 is disposed on a portion of the top surface of the first layer 3051 where the second layer 3052 is not disposed, and on the top surface of the second layer 3052. Each of the plurality of first inclined surfaces 305a and the plurality of second inclined surfaces 305b is formed across the first layer 3051 and the second layer 3052.

The plurality of lower electrodes 61B are disposed on the plurality of first inclined surfaces 305a. The plurality of lower electrodes 61C are disposed on the plurality of second inclined surfaces 305b. As described above, since each of the first inclined surfaces 305a and the second inclined surfaces 305b is inclined with respect to the top surface 301a of the substrate 301, that is, the XY plane, each of the top surfaces of the plurality of lower electrodes 61B and each of the top surfaces of the plurality of lower electrodes 61C are also inclined with respect to the XY plane. Thus, it can be said that the plurality of first MR elements 50B and the plurality of second MR elements 50C are disposed on the inclined surfaces inclined with respect to the XY plane. The insulating layer 305 is a member for supporting each of the plurality of first MR elements 50B and the plurality of second MR elements 50C so as to allow such MR elements to be inclined with respect to the XY plane.

Note that in the example embodiment, the first inclined surfaces 305a are curved surfaces. Therefore, the first MR elements 50B are curved along the curved surfaces (the first inclined surfaces 305a). For the sake of convenience, in the present example embodiment, the magnetization directions of the magnetization pinned layers 52 of the first MR elements 50B are defined as straight directions as described above. The W1 direction and the −W1 direction that are the magnetization directions of the magnetization pinned layers 52 of the first MR elements 50B are also directions in which the tangents to the first inclined surfaces 305a at the vicinity of the first MR elements 50B extend.

Similarly, in the example embodiment, the second inclined surfaces 305b are curved surfaces. Therefore, the second MR elements 50C are curved along the curved surfaces (the second inclined surfaces 305b). For the sake of convenience, in the present example embodiment, the magnetization directions of the magnetization pinned layers 52 of the second MR elements 50C are defined as straight directions as described above. The W2 direction and the −W2 direction that are the magnetization directions of the magnetization pinned layers 52 of the second MR elements 50C are also directions in which the tangents to the second inclined surfaces 305b at the vicinity of the second MR elements 50C extend.

As shown in FIG. 5, the plurality of first MR elements 50B are disposed so that two or more MR elements 50B are arranged both in the U direction and in the V direction. The plurality of first MR elements 50B are aligned in a row on one first inclined surface 305a. Similarly, the plurality of second MR elements 50C are disposed so that two or more MR elements 50C are arranged both in the U direction and in the V direction. The plurality of second MR elements 50C are aligned in a row on one second inclined surface 305b. In the example embodiment, the row of the plurality of first MR elements 50B and the row of the plurality of second MR elements 50C are alternately arranged in the direction parallel to the V direction.

Note that one first MR element 50B and one second MR element 50C adjoining each other may or may not deviate in the direction parallel to the U direction when seen in the Z direction. Two first MR elements 50B adjoining each other across one second MR element 50C may or may not deviate in the direction parallel to the U direction when seen in the Z direction. Two second MR elements 50C adjoining each other across one first MR element 50B may or may not deviate in the direction parallel to the U direction when seen in the Z direction.

The plurality of first MR elements 50B are connected in series by the plurality of lower electrodes 61B and the plurality of upper electrodes 62B. Herein, a method for connecting the plurality of first MR elements 50B will be described in detail with reference to FIG. 7. In FIG. 7, the reference sign 61 denotes a lower electrode corresponding to a given MR element 50, and the reference numeral 62 denotes an upper electrode corresponding to the given MR element 50. As shown in FIG. 7, each lower electrode 61 has a long slender shape. Two lower electrodes 61 adjoining in the longitudinal direction of the lower electrodes 61 have a gap therebetween. MR elements 50 are disposed near both longitudinal ends on the top surface of each lower electrode 61. Each upper electrode 62 has a long slender shape, and electrically connects two adjoining MR elements 50 that are disposed on two lower electrodes 61 adjoining in the longitudinal direction of the lower electrodes 61.

Although not shown, one MR element 50 located at the end of a row of a plurality of aligned MR elements 50 is connected to another MR element 50 located at the end of another row of a plurality of MR elements 50 adjoining in a direction intersecting with the longitudinal direction of the lower electrodes 61. Such two MR elements 50 are connected to each other by a not-shown electrode. The not-shown electrode may be an electrode that connects the bottom surfaces or the top surfaces of the two MR elements 50.

In a case where the MR elements 50 shown in FIG. 7 are the first MR elements 50B, the lower electrodes 61 shown in FIG. 7 correspond to the lower electrodes 61B, and the upper electrodes 62 shown in FIG. 7 correspond to the upper electrodes 62B. In such a case, the longitudinal direction of the lower electrodes 61 is parallel to the U direction.

Similarly, the plurality of second MR elements 50C are connected in series by the plurality of lower electrodes 61C and the plurality of upper electrodes 62C. The foregoing description of the method for connecting the plurality of first MR elements 50B holds true for the method for connecting the plurality of second MR elements 50C. In a case where the MR elements 50 shown in FIG. 7 are the second MR elements 50C, the lower electrodes 61 shown in FIG. 7 correspond to the lower electrodes 61C, and the upper electrodes 62 shown in FIG. 7 correspond to the upper electrodes 62C. In such a case, the longitudinal direction of the lower electrodes 61 is parallel to the U direction.

Note that in the example embodiment, a stacked film including the antiferromagnetic layer 51, the magnetization pinned layer 52, the gap layer 53, and the free layer 54 is described as the MR element 50. However, the MR element of the example embodiment may also be an element including such a stacked film, the lower electrode 61, and the upper electrode 62. The stacked film includes a plurality of magnetic films. The lower electrode 61 is a nonmagnetic metal layer disposed between the protruding surface 305c and the plurality of magnetic films. The MR element may also include a plurality of stacked films, a plurality of lower electrodes 61, and a plurality of upper electrodes 62.

Each of the plurality of upper coil elements 82 extends in a direction parallel to the Y direction. The plurality of upper coil elements 82 are arranged in the X direction. In particular, in the present example embodiment, when seen in the Z direction, each of the plurality of first MR elements 50B and the plurality of second MR elements 50C overlaps two upper coil elements 82.

Each of the plurality of lower coil elements 81 extends in a direction parallel to the Y direction. The plurality of lower coil elements 81 are arranged in the X direction. The shape and arrangement of the plurality of lower coil elements 81 may be the same as or different from those of the plurality of upper coil elements 82. In the example shown in FIGS. 5 and 6, the dimension in the X direction of each of the plurality of lower coil elements 81 is smaller than the dimension in the X direction of each of the plurality of upper coil elements 82. The distance between two lower coil elements 81 adjoining in the X direction is smaller than the distance between two upper coil elements 82 adjoining in the X direction.

In the example shown in FIGS. 5 and 6, the plurality of lower coil elements 81 and the plurality of upper coil elements 82 are electrically connected so as to constitute the coil 80 that applies a magnetic field in a direction parallel to the X direction to the free layer 54 in each of the plurality of first MR elements 50B and the plurality of second MR elements 50C. Alternatively, the coil 80 may be configured to be able to, for example, apply a magnetic field in the X direction to the free layers 54 in the first and second resistor sections R21 and R22 of the first detection circuit 20 and the first and second resistor sections R31 and R32 of the second detection circuit 30, and apply a magnetic field in the −X direction to the free layers 54 in the third and fourth resistor sections R23 and R24 of the first detection circuit 20 and the third and fourth resistor sections R33 and R34 of the second detection circuit 30. The coil 80 may be controlled by the processor 40.

Next, the first and second detection signals will be described. First, the first detection signal will be described with reference to FIG. 3. As the strength of the component of the target magnetic field in the direction parallel to the W1 direction changes, the resistance of each of the resistor sections R21 to R24 of the first detection circuit 20 changes either so that the resistances of the resistor sections R21 and R23 increase and the resistances of the resistor sections R22 and R24 decrease or so that the resistances of the resistor sections R21 and R23 decrease and the resistances of the resistor sections R22 and R24 increase. Thereby the electric potential of each of the signal output ports E21 and E22 changes. The first detection circuit 20 generates a signal corresponding to the electric potential of the signal output port E21 as a first detection signal S21, and generates a signal corresponding to the electric potential of the signal output port E22 as a first detection signal S22.

Next, the second detection signal will be described with reference to FIG. 4. As the strength of the component of the target magnetic field in the direction parallel to the W2 direction changes, the resistance of each of the resistor sections R31 to R34 of the second detection circuit 30 changes either so that the resistances of the resistor sections R31 and R33 increase and the resistances of the resistor sections R32 and R34 decrease or so that the resistances of the resistor sections R31 and R33 decrease and the resistances of the resistor sections R32 and R34 increase. Thereby the electric potential of each of the signal output ports E31 and E32 changes. The second detection circuit 30 generates a signal corresponding to the electric potential of the signal output port E31 as a second detection signal S31, and generates a signal corresponding to the electric potential of the signal output port E32 as a second detection signal S32.

Next, the operation of the processor 40 will be described. The processor 40 is configured to generate the first detection value and the second detection value based on the first detection signals S21 and S22 and the second detection signals S31 and S32. The first detection value is a detection value corresponding to the component of the target magnetic field in the direction parallel to the V direction. The second detection value is a detection value corresponding to the component of the target magnetic field in the direction parallel to the Z direction. The first detection value is represented by a symbol Sv, and the second detection value is represented by a symbol Sz.

The processor 40 generates the first and second detection values Sv and Sz as follows, for example. First, the processor 40 generates a value S1 by an arithmetic including obtainment of the difference S21-S22 between the first detection signal S21 and the first detection signal S22, and generates a value S2 by an arithmetic including obtainment of the difference S31-S32 between the second detection signal S31 and the second detection signal S32. Next, the processor 40 calculates values S3 and S4 using the following expressions (1) and (2).

$$S3=(S2+S1)/(2 \cos \alpha) \quad (1)$$

$$S4=(S2-S1)/(2 \sin \alpha) \quad (2)$$

The first detection value Sv may be the value S3 itself, or may be a result of a predetermined correction, such as a gain adjustment or an offset adjustment, made to the value S3. In the same manner, the second detection value Sz may be the value S4 itself, or may be a result of a predetermined correction, such as a gain adjustment or an offset adjustment, made to the value S4.

Figure 8:
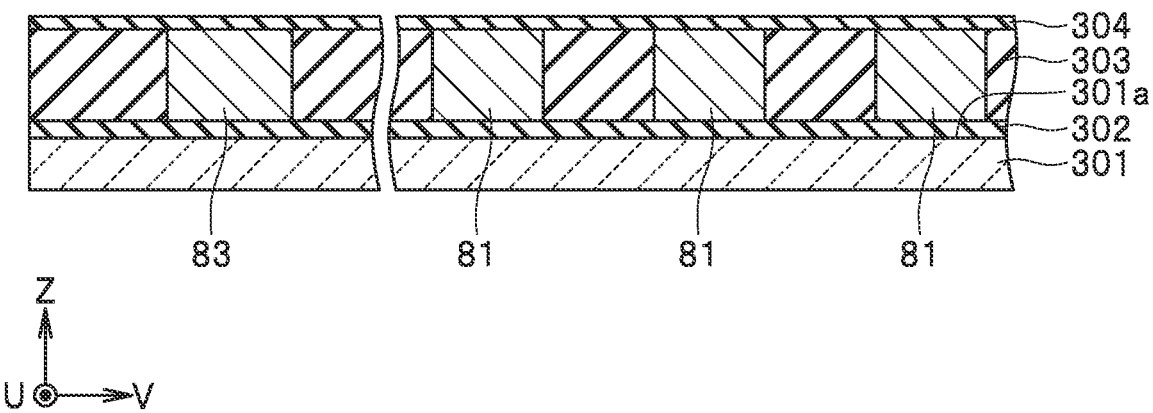
FIG. 8 is a sectional view showing a step of a method for manufacturing the magnetic sensor according to the example embodiment of the technology.

Next, a method for manufacturing the magnetic sensor 1 according to the example embodiment will be described with reference to FIGS. 8 to 11. FIGS. 8 to 11 each show a stack during a process of manufacturing the magnetic sensor 1. In the method for manufacturing the magnetic sensor 1, first, the insulating layer 302 is formed on the substrate 301 as shown in FIG. 8. Next, the plurality of lower coil elements 81, a connection layer 83 of a conductive material, and the insulating layer 303 are formed on the insulating layer 302. Next, the insulating layer 304 is formed on the plurality of lower coil elements 81, the connection layer 83, and the insulating layer 303.

Figure 9:
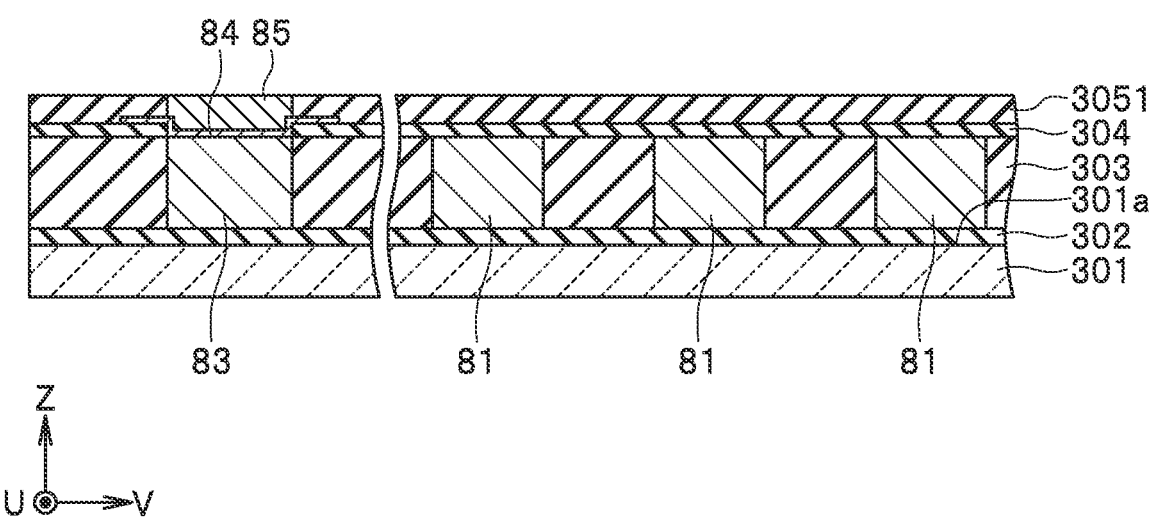
FIG. 9 is a sectional view showing a step that follows the step shown in FIG. 8.

FIG. 9 shows the following step. In the step, the insulating layer 304 is selectively etched so that an opening for exposing the top surface of the connection layer 83 is formed in the insulating layer 304. Next, a metal film 84 of a conductive material is formed on the top surface of the connection layer 83. Next, a connection layer 85 of a conductive material is formed on the metal film 84. Next, the first layer 3051 of the insulating layer 305 is formed around the connection layer 85.

Figure 10:
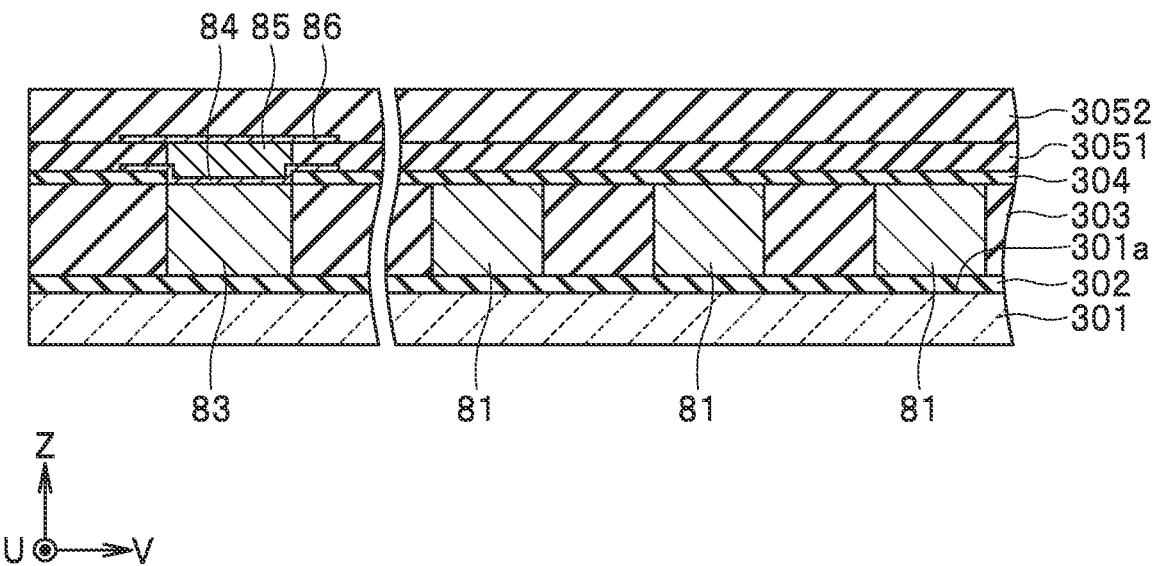
FIG. 10 is a sectional view showing a step that follows the step shown in FIG. 9.

FIG. 10 shows the following step. In the step, first, a metal film 86 of a conductive material is formed on the top surface of the connection layer 85. Next, the second layer 3052 of the insulating layer 305 is formed on the metal film 86 and the first layer 3051 of the insulating layer 305.

Figure 11:
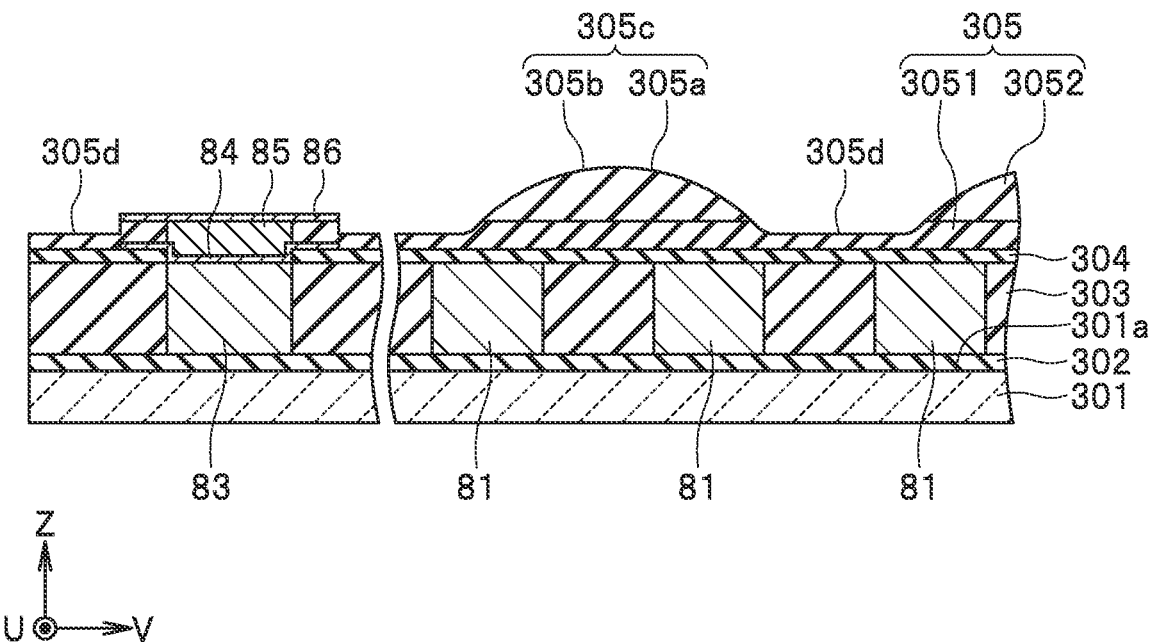
FIG. 11 is a sectional view showing a step that follows the step shown in FIG. 10.

FIG. 11 shows the following step. In the step, the first layer 3051 and the second layer 3052 are etched so that the plurality of protruding surfaces 305c are formed on the insulating layer 305. The plurality of protruding surfaces 305c are formed by, for example, forming a plurality of etching masks on the second layer 3052 and then etching the first layer 3051, the second layer 3052, and the plurality of etching masks so as to remove the plurality of etching masks. The plurality of etching masks have shapes corresponding to the plurality of protruding surfaces 305c. A portion of the first layer 3051 not covered with the plurality of etching masks becomes the flat surface 305d. During the etching, the metal film 86 functions as an etching stopper for protecting the connection layer 85.

The connection layer 85 is a structure embedded in the first layer 3051. The connection layer 85 includes an end surface farthest from the top surface 301a of the substrate 301, that is, a top surface. The end surface (top surface) of the connection layer 85 is disposed at substantially the same position as an interface between the first layer 3051 and the second layer 3052 in the direction perpendicular to the top surface 301a of the substrate 301, that is, the direction parallel to the Z direction.

Hereinafter, a step to be performed after the first layer 3051 and the second layer 3052 are etched will be described with reference to FIG. 6. First, the insulating layer 306 is formed on the first layer 3051 and the second layer 3052. Next, the plurality of lower electrodes 61B, the plurality of lower electrodes 61C, the plurality of first MR elements 50B, the plurality of second MR elements 50C, the plurality of upper electrodes 62B, the plurality of upper electrodes 62C, and the insulating layers 307 to 309 are formed on the insulating layer 306.

Next, the insulating layer 310 is formed on the plurality of upper electrodes 62B, the plurality of upper electrodes 62C, and the insulating layer 309. Next, the plurality of upper coil elements 82 are formed on the insulating layer 310. Thereby the magnetic sensor 1 is completed.

The connection layers 83 and 85 may be used as connection portions for connecting the plurality of lower coil elements 81 and the plurality of upper coil elements 82. In such a case, for example, after the insulating layer 310 is formed and before the plurality of upper coil elements 82 are formed, the insulating layers 306 to 310 may be selectively etched to form an opening for exposing the metal film 86, and then, a not-shown connection layer of a conductive material may be formed in the opening. The plurality of upper coil elements 82 are formed to be connected to the not-shown connection layer after the not-shown connection layer is formed.

Alternatively, the metal film 86 may be used as a given electrode pad (for example, an electrode pad of the coil 80). In such a case, for example, a photoresist layer that covers the metal film 86 may be formed after the first layer 3051 and the second layer 3052 are etched and before the insulating layer 306 is formed. The photoresist layer is removed after the upper coil elements 82 are formed, for example.

Next, features of the structure of the magnetic sensor 1 according to the example embodiment will be described. The magnetic sensor 1 includes the substrate 301 with the top surface 301a, the support member disposed on the substrate 301, the first MR elements 50B, and the second MR elements 50C. In particular, in the example embodiment, the insulating layer 305 corresponds to the support member. The plurality of lower coil elements 81 and the insulating layers 302 to 304 are disposed between the substrate 301 and the insulating layer 305. The insulating layer 305 includes the first inclined surfaces 305a and the second inclined surfaces 305b.

Each of the first and second MR elements 50B and 50C includes at least two magnetic films, that is, the magnetization pinned layer 52 and the free layer 54. The two magnetic films of each first MR element 50B form a part (a main part) of the first MR element 50B. The two magnetic films of each second MR element 50C form a part (a main part) of the second MR element 50C. Hereinafter, such two magnetic films will be referred to as functional layers. The functional layers of the first MR elements 50B are disposed on the first inclined surfaces 305a. The functional layers of the second MR elements 50C are disposed on the second inclined surfaces 305b. The insulating layer 305 includes the first layer 3051 and the second layer 3052 disposed on the first layer 3051. Each of the first layer 3051 and the second layer 3052 is formed of an insulating material, such as $SiO_2$.

Figure 12:
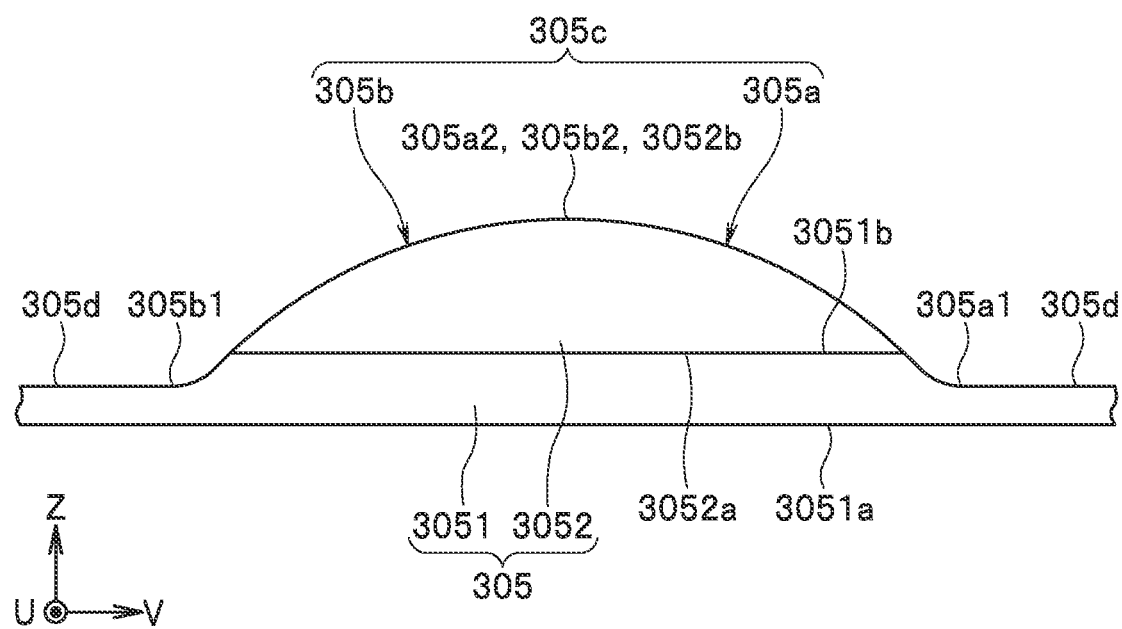
FIG. 12 is an explanatory view for illustrating a shape of a support member of the example embodiment of the technology.

Hereinafter, features of the first inclined surface 305a, the second inclined surface 305b, the first layer 3051, and the second layer 3052 will be described in detail with reference to FIG. 12. FIG. 12 is an explanatory view for illustrating the shape of the support member, that is, the insulating layer 305.

Each of the first inclined surface 305a and the second inclined surface 305b is formed across the first layer 3051 and the second layer 3052. The first inclined surface 305a and the second inclined surface 305b face different directions. Regarding one protruding surface 305c, the first inclined surface 305a and the second inclined surface 305b may be symmetrical about a virtual UZ plane perpendicular to the top surface 301a of the substrate 301.

From the perspective of reducing the height of the magnetic sensor 1, the dimension of each of the first inclined surface 305a and the second inclined surface 305b in the direction perpendicular to the top surface 301a of the substrate 301, that is, the direction parallel to the Z direction is preferably in the range from 1.4 μm or more to 3.0 μm or less.

The first inclined surface 305a includes a first end edge 305a1 closest to the top surface 301a of the substrate 301, and a second end edge 305a2 farthest from the top surface 301a of the substrate 301. The first end edge 305a1 is located in the first layer 3051. The second end edge 305a2 is located in the second layer 3052.

The second inclined surface 305b includes a first end edge 305b1 closest to the top surface 301a of the substrate 301, and a second end edge 305b2 farthest from the top surface 301a of the substrate 301. The first end edge 305b1 is located in the first layer 3051. The second end edge 305b2 is located in the second layer 3052. Note that in the example shown in FIG. 12, the second end edge 305b2 of the second inclined surface 305b coincides with the second end edge 305a2 of the first inclined surface 305a.

The first layer 3051 includes a lower end portion 3051a closest to the top surface 301a of the substrate 301, and an upper end portion 3051b farthest from the top surface 301a of the substrate 301. The second layer 3052 includes a lower end portion 3052a closest to the top surface 301a of the substrate 301, and an upper end portion 3052b farthest from the top surface 301a of the substrate 301. The distance from the interface between the first layer 3051 and the second layer 3052 to the lower end portion 3051a of the first layer 3051 is shorter than the distance from the interface between the first layer 3051 and the second layer 3052 to the upper end portion 3052b of the second layer 3052.

The first end edge 305a1 of the first inclined surface 305a is disposed between the lower end portion 3051a and the upper end portion 3051b of the first layer 3051 in the direction perpendicular to the top surface 301a of the substrate 301, that is, the direction parallel to the Z direction. The first end edge 305b1 of the second inclined surface 305b is disposed between the lower end portion 3051a and the upper end portion 3051b of the first layer 3051 in the direction parallel to the Z direction.

The functional layers of the first MR elements 50B are disposed along the surface of the second layer 3052, but are not disposed along the surface of the first layer 3051. The functional layers of the second MR elements 50C are disposed along the surface of the second layer 3052, but are not disposed along the surface of the first layer 3051.

In the example embodiment, the first inclined surface 305a is a smooth curved surface as a whole. The first inclined surface 305a includes no step at the position of a boundary between the first layer 3051 and the second layer 3052. Similarly, in the example embodiment, the second inclined surface 305b is a smooth curved surface as a whole. The second inclined surface 305b includes no step at the position of a boundary between the first layer 3051 and the second layer 3052.

Figure 13:
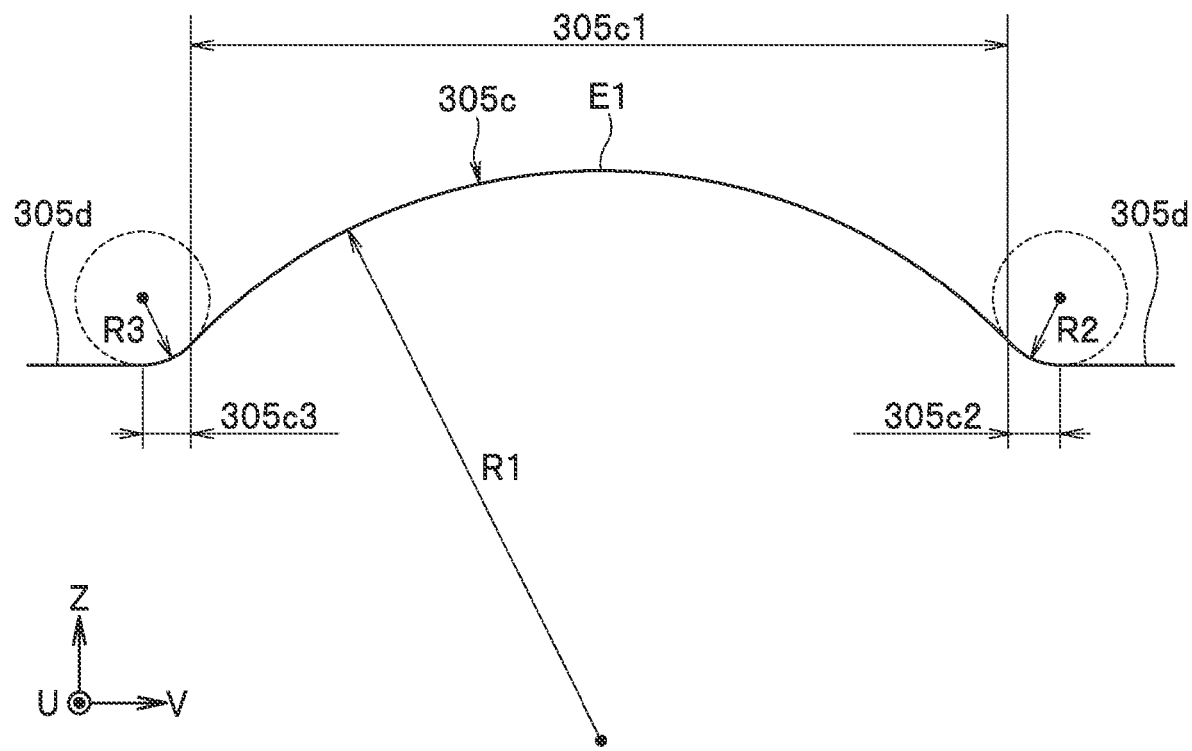
FIG. 13 is an explanatory view for illustrating a shape of a protruding surface of the example embodiment of the technology.

Next, features of the protruding surface 305c of the support member, that is, the insulating layer 305 will be described with reference to FIG. 13. FIG. 13 is an explanatory view for illustrating the shape of the protruding surface 305c. The insulating layer 305 includes the protruding surface 305c. The protruding surface 305c protrudes in the direction away from the top surface 301a of the substrate 301. At least a part of the protruding surface 305c is inclined with respect to the top surface 301a of the substrate 301. In particular, in the example embodiment, the protruding surface 305c includes the first inclined surface 305a and the second inclined surface 305b.

The protruding surface 305c includes an upper end portion E1 farthest from the top surface 301a of the substrate 301. The upper end portion E1 may coincide with the second end edge 305a2 of the first inclined surface 305a and the second end edge 305b2 of the second inclined surface 305b shown in FIG. 12.

The dimension of the protruding surface 305c in the direction perpendicular to the top surface 301a of the substrate 301, that is, the direction parallel to the Z direction is the same as the dimension of each of the first and second inclined surfaces 305a and 305b in the direction parallel to the Z direction. In other words, the dimension of the protruding surface 305c in the direction parallel to the Z direction is preferably in the range from 1.4 μm or more to 3.0 μm or less. The dimension of the protruding surface 305c in the direction parallel to the V direction is preferably greater than or equal to 3 μm and less than or equal to 16 μm, for example.

The protruding surface 305c includes: a first curved surface portion 305c1 including the upper end portion E1; a second curved surface portion 305c2; and a third curved surface portion 305c3. The second curved surface portion 305c2 is continuous with the first curved surface portion 305c1 at a position on the side of the V direction of the first curved surface portion 305c1, and is located between the first curved surface portion 305c1 and the top surface 301a of the substrate 301 in the direction perpendicular to the top surface 301a of the substrate 301. The third curved surface portion 305c3 is continuous with the first curved surface portion 305c1 at a position on the side opposite to the second curved surface portion 305c2, that is, a position on the side of the −V direction of the first curved surface portion 305c1, and is located between the first curved surface portion 305c1 and the top surface 301a of the substrate 301 in the direction perpendicular to the top surface 301a of the substrate 301. Each of the second curved surface portion 305c2 and the third curved surface portion 305c3 is continuous with the flat surface 305d.

The first curved surface portion 305c1 is a curved surface protruding in the direction away from the top surface 301a of the substrate 301. Each of the second curved surface portion 305c2 and the third curved surface portion 305c3 is a curved surface protruding in a direction closer to the top surface 301a of the substrate 301.

Herein, a cross section that is perpendicular to the top surface 301a of the substrate 301 and is parallel to the VZ plane is referred to as a reference cross section. The first curved surface portion 305c1 can be approximated to an arc in the reference cross section. In FIG. 13, the radius of curvature of the first curved surface portion 305c1 in the reference cross section, that is, the radius of curvature of an arc to which the entire first curved surface portion 305c1 is approximated is represented by a symbol R1. The radius of curvature R1 is preferably greater than or equal to 4.25 µm and less than or equal to 5.45 µm.

Similarly, each of the second curved surface portion 305c2 and the third curved surface portion 305c3 can be approximated to an arc in the reference cross section. In FIG. 13, the radius of curvature of the second curved surface portion 305c2 in the reference cross section, that is, the radius of curvature of an arc to which the second curved surface portion 305c2 is approximated is represented by a symbol R2, and the radius of curvature of the third curved surface portion 305c3 in the reference cross section, that is, the radius of curvature of an arc to which the third curved surface portion 305c3 is approximated is represented by a symbol R3. Each of the radii of curvature R2 and R3 is preferably smaller than the radius of curvature R1 and greater than or equal to 0.3 µm.

Figure 14:
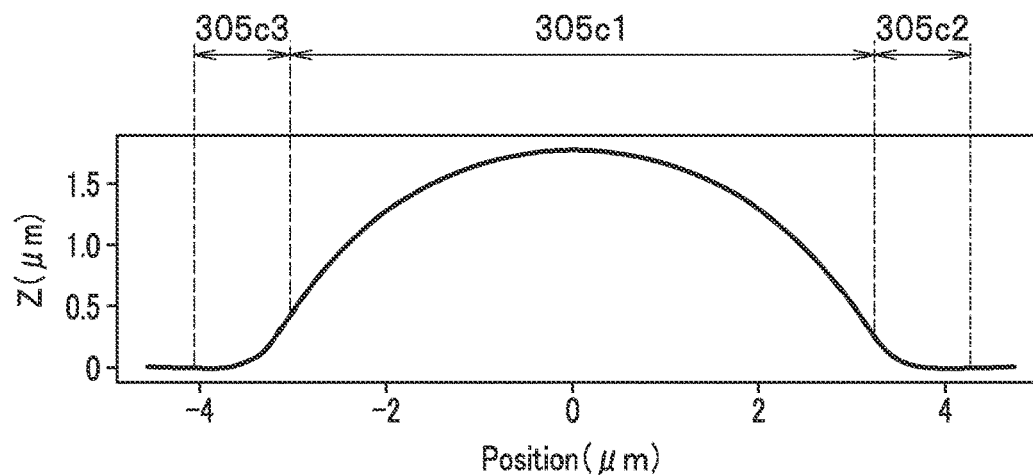
FIG. 14 is an explanatory chart showing a graph of a function representing the shape of the protruding surface of the example embodiment of the technology.

Herein, the shape of the protruding surface 305c in the reference cross section is regarded as a function Z having as an independent variable a position on a virtual straight line that is parallel to each of the reference cross section and the top surface 301a of the substrate 301. The virtual straight line is parallel to the V direction. Hereinafter, the virtual straight line will be referred to as a V axis, and a position on the V axis is represented by a symbol v. The function Z is a function having v as an independent variable. The value of the function Z corresponds to the position of the protruding surface 305c in the direction parallel to the Z direction. FIG. 14 shows a graph of the function Z. In FIG. 14, the abscissa axis represents the position on the V axis, and the ordinate axis represents the value of the function Z. FIG. 14 substantially shows the shape of the protruding surface 305c in the reference cross section.

Note that in FIG. 14, a position on the V axis corresponding to the upper end portion E1 of the protruding surface 305c is set as the origin (0 µm) on the abscissa axis, and a position on the side of the V direction with respect to the origin is represented by a positive value, while a position on the side of the −V direction with respect to the origin is represented by a negative value. In FIG. 14, the position of the flat surface 305d in the direction parallel to the Z direction is 0 µm.

Figure 15:
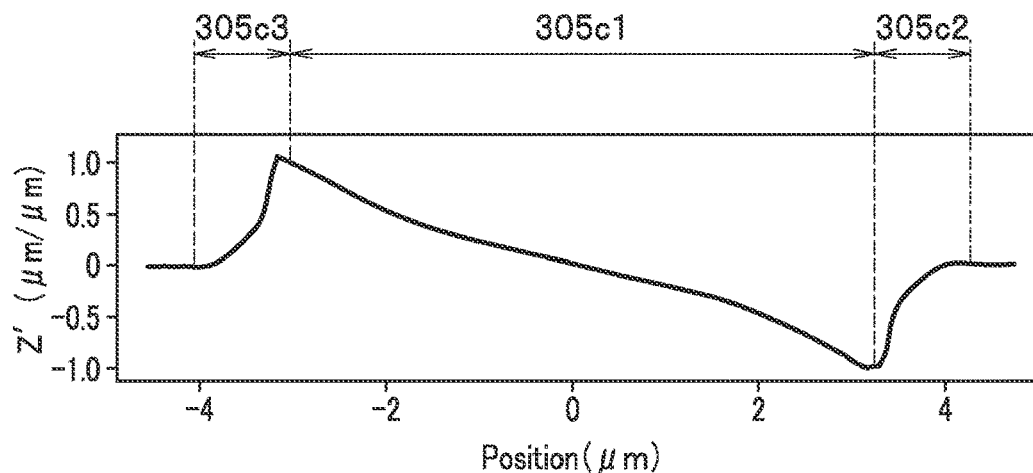
FIG. 15 is an explanatory chart showing a graph of a first derivative of the function shown in FIG. 14.
Figure 16:
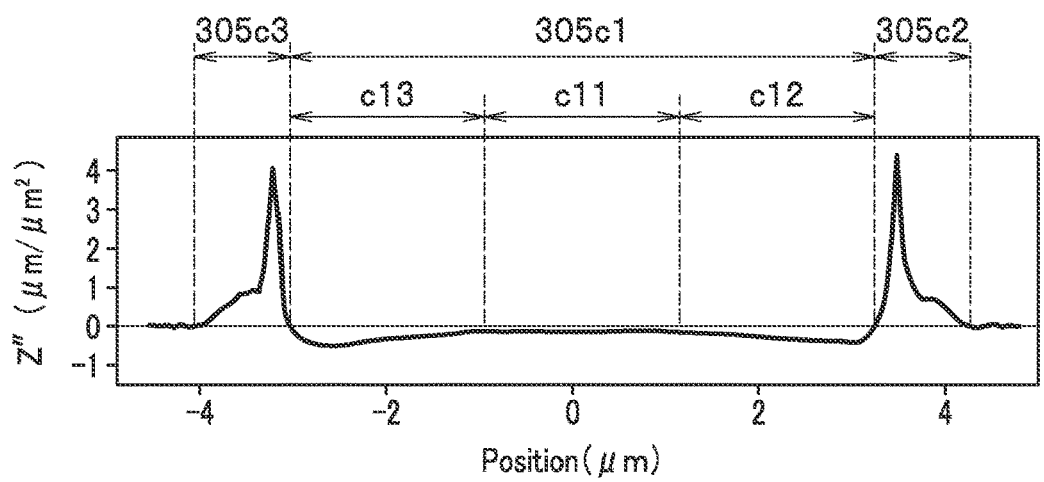
FIG. 16 is an explanatory chart showing a graph of a second derivative of the function shown in FIG. 14.

FIG. 15 shows a graph of a first derivative Z'(dZ/dv) obtained by differentiating the function Z once using the variable v. In FIG. 15, the abscissa axis represents the position on the V axis, and the ordinate axis represents the value of the first derivative Z'. FIG. 16 shows a graph of a second derivative Z" ($d^2Z/dv^2$) obtained by differentiating the function Z twice using the variable v. In FIG. 15, the abscissa axis represents the position on the V axis, and the ordinate axis represents the value of the second derivative Z".

Two positions where the second derivative Z" is 0 respectively represent a position on the V axis corresponding to a boundary between the first curved surface portion 305c1 and the second curved surface portion 305c2 and a position on the V axis corresponding to a boundary between the first curved surface portion 305c1 and the third curved surface portion 305c3. Thus, referring to FIG. 16 can identify the position of each of the first to third curved surface portions 305c1 to 305c3. FIGS. 14 to 16 show the general range of each of the first to third curved surface portions 305c1 to 305c3.

As shown in FIG. 16, at a position on the V axis corresponding to the first curved surface portion 305c1, the value of the second derivative Z" is less than or equal to 0. At a position on the V axis corresponding to the second curved surface portion 305c2 and at a position on the V axis corresponding to the third curved surface portion 305c3, the value of the second derivative Z" is a positive value.

Herein, as shown in FIG. 16, the first curved surface portion 305c1 is divided into a first portion c11, a second portion c12, and a third portion c13. The first portion c11 is a portion including the upper end portion E1 of the protruding surface 305c. The second portion c12 is a portion continuous with the first portion c11 at a position away from the upper end portion E1 of the protruding surface 305c and on the side of the V direction of the first portion c11. The third portion c13 is a portion continuous with the first portion c11 at a position away from the upper end portion E1 of the protruding surface 305c and on the side of the −V direction of the first portion c11. The second portion c12 is located below (on the side of the −Z direction of) the first MR element 50B. The third portion c13 is located below (on the side of the −Z direction of) the second MR element 50C. The first and second MR elements 50B and 50C are not present above (on the side of the Z direction of) the first portion c11. FIG. 16 shows the general range of each of the first to third portions c11 to c13.

The mean value of the absolute value of the second derivative Z" of the function Z corresponding to the first portion c11 is smaller than the mean value of the absolute value of the second derivative Z" of the function Z corresponding to the second portion c12. Similarly, the mean value of the absolute value of the second derivative Z" of the function Z corresponding to the first portion c11 is smaller than the mean value of the absolute value of the second derivative Z" of the function Z corresponding to the third portion c13.

In the example embodiment, the value of the first derivative Z' of the function Z corresponding to the first curved surface portion 305c1 decreases or increases in a direction closer to one end of the first curved surface portion 305c1 in the direction parallel to the V direction from the other end of the first curved surface portion 305c1 in the direction parallel to the V direction. In other words, the value of the first derivative Z' becomes smaller in a direction closer to an end portion of the first curved surface portion 305c1 on the side of the V direction from an end portion of the first curved surface portion 305c1 on the side of the −V direction. Alternatively, the value of the first derivative Z' becomes greater in a direction closer to the end portion of the first curved surface portion 305c1 on the side of the −V direction from the end portion of the first curved surface portion 305c1 on the side of the V direction.

Next, operations and effects of the magnetic sensor 1 according to the example embodiment will be described. In the example embodiment, the support member, that is, the insulating layer 305 includes the first layer 3051 and the second layer 3052, and also includes the first and second inclined surfaces 305a and 305b formed across the first layer 3051 and the second layer 3052. Herein, a case is considered where a structure of a metallic material is embedded in a support member, which includes only a single insulating layer, of a Comparative Example. In the support member of the Comparative Example, if an inclined surface is formed on the support member by etching, the structure greatly protrudes beyond the surfaces formed by the etching due to the difference in the etching rates. In such a case, a problem would arise that it becomes difficult to perform patterning on some electrodes or MR elements formed on the inclined surface due to the influence of the shadow of the structure, for example.

In contrast, in the example embodiment, for example, the first inclined surface 305a and the second inclined surface 305b can be formed on the insulating layer 305 in such a state that a structure is embedded in the first layer 3051 and no structure is embedded in the second layer 3052. Thereby, according to the example embodiment, the amount of protrusion of the structure can be suppressed in comparison with the support member of the Comparative Example.

Note that the insulating material of the first layer 3051 and the insulating material of the second layer 3052 may be the same or different. In addition, film formation conditions of the first layer 3051 and film formation conditions of the second layer 3052 may be the same or different. For example, it is possible to, by varying at least one of the insulating materials or the film formation conditions of the first layer 3051 and the second layer 3052 from each other, vary the shape of a part of the protruding surface 305c formed on the first layer 3051 and the shape of another part of the protruding surface 305c formed on the second layer 3052 from each other.

In the example embodiment, the protruding surface 305c includes the first to third curved surface portions 305c1 to 305c3 each having the foregoing shape. If the second and third curved surface portions 305c2 and 305c3 are not present, the flat surface 305d and the first curved surface portion 305c1 become discontinuous at a boundary between the flat surface 305d and the first curved surface portion 305c1. Therefore, the surface of the insulating layer 305 does not become smooth. In contrast, in the example embodiment, since the protruding surface 305c includes the second and third curved surface portions 305c2 and 305c3, the surface of the insulating layer 305 can be made smooth. Thereby, according to the example embodiment, it is possible to suppress the generation of cracks in the insulating layer 305 near a boundary between the protruding surface 305c and the flat surface 305d.

As described above, the radius of curvature R1 of the first curved surface portion 305c1 of the protruding surface 305c differs from the radius of curvature R2 of the second curved surface portion 305c2 of the protruding surface 305c and the radius of curvature R3 of the third curved surface portion 305c3 of the protruding surface 305c. At least a part of the first curved surface portion 305c1 is formed on the second layer 3052. At least a part of each of the second and third curved surface portions 305c2 and 305c3 is formed on the first layer 3051. According to the example embodiment, it is possible to individually adjust the etching rate of the first layer 3051 and the etching rate of the second layer 3052 by varying at least one of the insulating materials or the film formation conditions of the first layer 3051 and the second layer 3052 from each other, for example. Thereby, according to the example embodiment, it is possible to easily adjust the radii of curvature R2 and R3 to a preferable range while adjusting the radius of curvature R1 to a preferable range.

In particular, in the example embodiment, adjusting the radii of curvature R2 and R3 to the foregoing range can suppress the generation of cracks in the insulating layer 305 near the boundary between the protruding surface 305c and the flat surface 305d in comparison with when the second and third curved surface portions 305c2 and 305c3 are not present or when the radii of curvature are small to such an extent that the boundary between the protruding surface 305c and the flat surface 305d can be regarded as discontinuous.

Note that in the example embodiment, as understood from FIG. 16, the value of the second derivative $Z''$ of the function Z corresponding to the first curved surface portion 305c1 is not constant. Therefore, in a strict sense, the radius of curvature R1 varies depending on the position on the V axis. In particular, in the example embodiment, the mean value of the absolute value of the second derivative $Z''$ of the function Z corresponding to the first portion c11 of the first curved surface portion 305c1 is smaller than the mean value of the absolute value of the second derivative $Z''$ of the function Z corresponding to the second portion c12 of the first curved surface portion 305c1 and the mean value of the absolute value of the second derivative $Z''$ of the function Z corresponding to the third portion c13 of the first curved surface portion 305c1. Therefore, in the example embodiment, the radius of curvature R1 at the first portion c11 is greater than the radius of curvature R1 at the second portion c12 and the radius of curvature R1 at the third portion c13. Thereby, according to the example embodiment, it is possible to reduce the dimension of the protruding surface 305c in the direction parallel to the Z direction, that is, reduce the height of the protruding surface 305c in comparison with when the radius of curvature R1 is constant irrespective of the position on the V axis.

In the example embodiment, the dimension of the protruding surface 305c in the direction parallel to the Z direction is preferably in the range from 1.4 μm or more to 3.0 μm or less. According to the example embodiment, setting the dimension of the protruding surface 305c to greater than or equal to 1.4 μm can increase the inclination of each of the first inclined surface 305a and the second inclined surface 305b and thus enhance the sensitivity of the magnetic sensor 1 to the component of the target magnetic field in the direction parallel to the Z direction. Consequently, according to the example embodiment, the second detection value Sz can be generated with high accuracy. In addition, according to the example embodiment, setting the dimension of the protruding surface 305c to less than or equal to 3.0 μm can form a photoresist mask including a photoresist layer with high accuracy on the first inclined surface 305a and the second inclined surface 305b during the process of manufacturing the magnetic sensor 1.

The technology is not limited to the foregoing example embodiment, and various modifications may be made thereto. For example, the magnetic detection elements are not limited to MR elements, and may be other elements such as Hall elements that detect a magnetic field.

The support member of the technology may also include the insulating layer 305 and the insulating layer 306. In such a case, the support member includes a plurality of protruding surfaces and a flat surface. The plurality of protruding surfaces and the flat surface are formed by the top surface of the insulating layer 306. The top surface of the insulating layer 306 is similar to or almost similar to the top surface of the insulating layer 305. Thus, the plurality of protruding surfaces formed by the top surface of the insulating layer 306 are similar to or almost similar to the plurality of protruding surfaces 305c of the insulating layer 305. The description of the shapes and arrangement of the plurality of protruding surfaces 305c holds true for the plurality of protruding surfaces formed by the top surface of the insulating layer 306 except the description of the first layer 3051 and the second layer 3052. Specifically, the description of the dimension of the protruding surfaces 305c, the description of the radii of curvature R1 to R3, and the description of the function Z, the first derivative $Z'$, and the second derivative $Z''$ hold true for the plurality of protruding surfaces formed by the top surface of the insulating layer 306.

The magnetic sensor 1 may further include a third detection circuit configured to detect a component of the target magnetic field in a direction parallel to the XY plane, and generate at least one third detection signal having a correspondence with the component. In such a case, the processor 40 may be configured to generate a detection value corresponding to a component of the target magnetic field in the direction parallel to the U direction based on the at least one third detection signal. The third detection circuit may be integrated with the first and second detection circuits 20 and 30, or may be included in a chip separate from the first and second detection circuits 20 and 30.

Each sensor element of the technology is not limited to a magnetic detection element, and may be a sensor element configured to change in a physical property depending on a predetermined physical quantity. The predetermined physical quantity may be the quantity of the state of any physical phenomenon that can be detected by the sensor element, such as not only a magnetic field but also an electric field, temperature, displacement, and force. The foregoing description of the example embodiment holds true for, other than a magnetic sensor, a sensor including sensor elements other than magnetic detection elements if the magnetic detection elements are replaced with the sensor elements. In such a case, the functional layers may be a portion that constitutes at least a part of each sensor element and changes in a physical property depending on a predetermined physical quantity. In such a case, the metal layer may be any wiring layer.

As described above, the sensor according to one embodiment of the technology is a sensor configured to detect a predetermined physical quantity. The sensor according to one embodiment of the technology includes a substrate including a top surface, a support member disposed on the substrate, and a sensor element configured to change in a physical property depending on a predetermined physical quantity. The support member includes a first layer and a second layer disposed on the first layer, and also includes at least one inclined surface formed across the first layer and the second layer. Each sensor element includes functional layers constituting at least a part of the sensor element. The functional layers are disposed on the at least one inclined surface.

In the sensor according to one embodiment of the technology, the at least one inclined surface may include a first end edge closest to the top surface of the substrate, and a second end edge farthest from the top surface of the substrate. The first end edge may be located in the first layer. The second end edge may be located in the second layer. The first layer may include a lower end portion closest to the top surface of the substrate, and an upper end portion farthest from the top surface of the substrate. The first end edge may be disposed between the lower end portion of the first layer and the upper end portion of the first layer in the direction perpendicular to the top surface of the substrate. The functional layers are disposed along the surface of the second layer, but need not be disposed along the surface of the first layer. The at least one inclined surface need not include a step at the position of the boundary between the first layer and the second layer.

In the sensor according to one embodiment of the technology, the at least one inclined surface may include two inclined surfaces facing different directions. The two inclined surfaces may be symmetrical about a virtual plane perpendicular to the top surface of the substrate.

In the sensor according to one embodiment of the technology, each of the first layer and the second layer may include a lower end portion closest to the top surface of the substrate, and an upper end portion farthest from the top surface of the substrate. The distance from an interface between the first layer and the second layer to the lower end portion of the first layer may be shorter than the distance from the interface between the first layer and the second layer to the upper end portion of the second layer.

In the sensor according to one embodiment of the technology, the dimension of the at least one inclined surface in the direction perpendicular to the top surface of the substrate may be in the range from 1.4 µm or more to 3.0 µm or less.

In the sensor according to one embodiment of the technology, the at least one inclined surface may be a smooth curved surface as a whole. In such a case, the support member may include a protruding surface protruding in the direction away from the top surface of the substrate and including the at least one inclined surface. The protruding surface may include an upper end portion farthest from the top surface of the substrate. The protruding surface may include a first curved surface portion including the upper end portion of the protruding surface, and a second curved surface portion continuous with the first curved surface portion and located between the first curved surface portion and the top surface of the substrate in the direction perpendicular to the top surface of the substrate. The first curved surface portion may be a curved surface protruding in the direction away from the top surface of the substrate. The second curved surface portion may be a curved surface protruding in the direction closer to the top surface of the substrate. The radius of curvature of the second curved surface portion in a cross section perpendicular to the top surface of the substrate may be smaller than the radius of curvature of the first curved surface portion in the cross section perpendicular to the top surface of the substrate, and may be greater than or equal to 0.3 µm. The radius of curvature of the first curved surface portion in the cross section perpendicular to the top surface of the substrate may be greater than or equal to 4.25 µm and less than or equal to 5.45 µm.

In the sensor according to one embodiment of the technology, when the at least one inclined surface is a smooth curved surface as a whole, the support member may include a protruding surface protruding in the direction away from the top surface of the substrate and including the at least one inclined surface. The protruding surface may include an upper end portion farthest from the top surface of the substrate and also include a curved surface portion including the upper end portion of the protruding surface and protruding in the direction away from the top surface of the substrate. The curved surface portion may include a first portion including the upper end portion of the protruding surface, and a second portion continuous with the first portion at a position away from the upper end portion of the protruding surface. When the shape of the protruding surface in the cross section perpendicular to the top surface of the substrate is regarded as a function Z having as a variable a position on a virtual straight line that is parallel to each of the cross section and the top surface of the substrate, the mean value of the absolute value of the second derivative Z" of the function Z corresponding to the first portion may be smaller than the mean value of the absolute value of the second derivative Z" of the function Z corresponding to the second portion. The value of the second derivative Z" of the function Z corresponding to the curved surface portion may be smaller than 0.

In the sensor according to one embodiment of the technology, each of the first layer and the second layer may be formed of an insulating material.

The sensor according to one embodiment of the technology may further include a structure embedded in the first layer. The structure may include an end surface farthest from the top surface of the substrate. The end surface of the structure may be disposed at substantially the same position as the interface between the first layer and the second layer in the direction perpendicular to the top surface of the substrate.

In the sensor according to one embodiment of the technology, the predetermined physical quantity may be at least one of the direction or strength of the target magnetic field. Each sensor element may be a magnetic detection element configured to detect a change in at least one of the direction or strength of the target magnetic field. The magnetic detection element may be a magnetoresistive element. The functional layers may include a plurality of magnetic films.

Obviously, various modification examples and variations of the technology are possible in the light of the above teachings. Thus, it is to be understood that, within the scope of the appended claims and equivalents thereof, the technology may be practiced in other embodiments than the foregoing example embodiment.

What is claimed is:

1. A sensor configured to detect a predetermined physical quantity, comprising:
   a substrate including a top surface;
   a support member disposed on the substrate; and
   a sensor element configured to change in a physical property depending on the predetermined physical quantity, wherein
   the support member includes a first layer and a second layer disposed on the first layer, and also includes at least one inclined surface formed across the first layer and the second layer, and
   the sensor element is supported by the support member.

2. The sensor according to claim 1, wherein
   the at least one inclined surface includes a first end edge closest to the top surface of the substrate, and a second end edge farthest from the top surface of the substrate,
   the first end edge is located in the first layer, and
   the second end edge is located in the second layer.

3. The sensor according to claim 2, wherein
   the first layer includes a lower end portion closest to the top surface of the substrate, and an upper end portion farthest from the top surface of the substrate, and
   the first end edge is disposed between the lower end portion of the first layer and the upper end portion of the first layer in a direction perpendicular to the top surface of the substrate.

4. The sensor according to claim 2, wherein at least a part of the sensor element is disposed along a surface of the second layer, but is not disposed along a surface of the first layer.

5. The sensor according to claim 2, wherein the at least one inclined surface includes no step at a position of a boundary between the first layer and the second layer.

6. The sensor according to claim 1, wherein the at least one inclined surface includes two inclined surfaces facing different directions.

7. The sensor according to claim 6, wherein the two inclined surfaces are symmetrical about a virtual plane perpendicular to the top surface of the substrate.

8. The sensor according to claim 1, wherein:
   each of the first layer and the second layer includes a lower end portion closest to the top surface of the substrate, and an upper end portion farthest from the top surface of the substrate, and
   a distance from an interface between the first layer and the second layer to the lower end portion of the first layer is shorter than a distance from the interface between the first layer and the second layer to the upper end portion of the second layer.

9. The sensor according to claim 1, wherein a dimension of the at least one inclined surface in a direction perpendicular to the top surface of the substrate is in a range from 1.4 µm or more to 3.0 µm or less.

10. The sensor according to claim 1, wherein the at least one inclined surface is a smooth curved surface as a whole.

11. The sensor according to claim 10, wherein
    the support member includes a protruding surface protruding in a direction away from the top surface of the substrate and including the at least one inclined surface,
    the protruding surface includes an upper end portion farthest from the top surface of the substrate,
    the protruding surface includes a first curved surface portion including the upper end portion of the protruding surface, and a second curved surface portion continuous with the first curved surface portion and located between the first curved surface portion and the top surface of the substrate in a direction perpendicular to the top surface of the substrate,
    the first curved surface portion is a curved surface protruding in the direction away from the top surface of the substrate,
    the second curved surface portion is a curved surface protruding in a direction closer to the top surface of the substrate, and
    a radius of curvature of the second curved surface portion in a cross section perpendicular to the top surface of the substrate is smaller than a radius of curvature of the first curved surface portion in the cross section perpendicular to the top surface of the substrate, and is greater than or equal to 0.3 µm.

12. The sensor according to claim 11, wherein the radius of curvature of the first curved surface portion in the cross section perpendicular to the top surface of the substrate is greater than or equal to 4.25 µm and less than or equal to 5.45 µm.

13. The sensor according to claim 10, wherein
    the support member includes a protruding surface protruding in a direction away from the top surface of the substrate and including the at least one inclined surface,
    the protruding surface includes an upper end portion farthest from the top surface of the substrate, and also includes a curved surface portion including the upper end portion of the protruding surface and protruding in the direction away from the top surface of the substrate,
    the curved surface portion includes a first portion including the upper end portion of the protruding surface, and a second portion continuous with the first portion at a position away from the upper end portion of the protruding surface, and
    when a shape of the protruding surface in a cross section perpendicular to the top surface of the substrate is regarded as a function Z having as a variable a position on a virtual straight line that is parallel to each of the cross section and the top surface of the substrate, a mean value of an absolute value of a second derivative Z" of the function Z corresponding to the first portion is smaller than a mean value of an absolute value of the second derivative Z" of the function Z corresponding to the second portion.

14. The sensor according to claim 13, wherein a value of the second derivative Z" of the function Z corresponding to the curved surface portion is less than or equal to 0.

15. The sensor according to claim 1, wherein each of the first layer and the second layer is formed of an insulating material.

16. The sensor according to claim 1, further comprising a structure embedded in the first layer, wherein
the structure includes an end surface farthest from the top surface of the substrate, and
the end surface of the structure is disposed at substantially a same position as an interface between the first layer and the second layer in a direction perpendicular to the top surface of the substrate.

17. The sensor according to claim 1, wherein
the predetermined physical quantity is at least one of a direction or a strength of a target magnetic field, and
the sensor element is a magnetic detection element configured to detect a change in at least one of the direction or the strength of the target magnetic field.

18. The sensor according to claim 17, wherein the magnetic detection element is a magnetoresistive element.

* * * * *